United States Patent
Harada et al.

(10) Patent No.: US 7,497,754 B2
(45) Date of Patent: Mar. 3, 2009

(54) METHOD FOR THINNING SUBSTRATE OF EL DEVICE

(75) Inventors: Masayuki Harada, Aichi (JP); Norihito Takeuchi, Aichi (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 590 days.

(21) Appl. No.: 11/082,727

(22) Filed: Mar. 17, 2005

(65) Prior Publication Data

US 2005/0245165 A1 Nov. 3, 2005

(30) Foreign Application Priority Data

Apr. 30, 2004 (JP) .................. P2004-136221

(51) Int. Cl.
*H01J 9/00* (2006.01)
(52) U.S. Cl. .................. 445/24
(58) Field of Classification Search ......... 445/23–25, 445/49–51; 216/84, 103
See application file for complete search history.

(56) References Cited

U.S. PATENT DOCUMENTS

| | | | | |
|---|---|---|---|---|
| 4,106,859 | A * | 8/1978 | Doriguzzi et al. | 349/113 |
| 6,258,699 | B1 | 7/2001 | Chang et al. | 438/458 |
| 6,646,711 | B2 * | 11/2003 | Sugano | 349/187 |
| 2003/0037874 | A1 | 2/2003 | Liau et al. | 156/306.3 |
| 2004/0119407 | A1 * | 6/2004 | Kim et al. | 313/512 |

FOREIGN PATENT DOCUMENTS

| | | |
|---|---|---|
| CN | 1378094 A | 11/2002 |
| DE | 100 17 337 A1 | 10/2001 |
| EP | 0 727 829 A2 | 8/1996 |
| JP | 5-249422 | 9/1993 |
| JP | 08-262419 | 10/1996 |
| JP | 8-262419 | 10/1996 |
| JP | 11-231 292 | 8/1999 |
| JP | 2003-43938 | 2/2003 |
| JP | 2003-043938 | 2/2003 |
| KR | 2000-21813 | 4/2000 |
| KR | 2004-19969 | 3/2004 |

OTHER PUBLICATIONS

Chinese Office Action dated Jan. 4, 2008, received in corresponding Chinese Patent Application No. 200510062746.6 with English translation.

* cited by examiner

*Primary Examiner*—Joseph L Williams
(74) *Attorney, Agent, or Firm*—Morgan & Finnegan, LLP

(57) ABSTRACT

Respective glass substrates 1 of a pair of such EL devices 3 are disposed in such a manner that EL element portions 2 formed on their respective front surfaces 1a are opposed to each other. Spacers 4 are disposed between the two glass substrates 1 so that the EL element portions 2 are separated from each other and do not interfere with each other. In this state, peripheral portions of the two glass substrates 1 are bonded to each other with a sealing material 5, whereby a hollow portion 6 formed between the two glass substrates 1 is sealed with the sealing material 5 and isolated from the outside. Then, the two glass substrates 1 that are integrated together are immersed in an etching liquid, that is, they are subjected to thinning processing.

11 Claims, 3 Drawing Sheets

METHOD FOR THINNING SUBSTRATE OF EL DEVICE

BACKGROUND OF THE INVENTION

1. Field of the Invention

The present invention relates to a method for thinning the substrate of an EL (electroluminescence) device.

2. Description of the Related Art

Conventionally, attempts have been being made widely to put into practical use EL devices such as inorganic EL devices and organic EL devices as displays and illumination devices of thin, lightweight portable apparatus because they exhibit high luminance and emit light by themselves. Those EL devices have a structure that an EL element portion having a pair of electrode layers at least one of which is a transparent electrode layer and a light-emitting layer interposed between the two electrode layers are formed on a substrate.

In those EL devices, to reduce the thickness and weight of the entire device, it is desired to employ a thin substrate.

However, when attempted to form an EL element portion on a thin glass substrate, for example, it may become difficult to manufacture an EL device because the operability is low in each manufacturing step due to bending of the substrate and other problems. It is therefore necessary to use a thick glass substrate in manufacture.

Liquid crystal display devices are the same as EL devices in that a display element portion is formed on a glass substrate (s). However, in liquid crystal display devices, since the display element portion is disposed between two glass substrates, a method of thinning both glass substrates by immersing the liquid crystal display device in an etching liquid has been proposed as disclosed in JP-A-8-262419, for example.

SUMMARY OF THE INVENTION

However, EL devices has the structure that an EL element portion is formed on a single glass substrate. Further, for thickness reduction, it is desired that the EL element portion be sealed with a film (film sealing) rather than glass. Therefore, if the method disclosed in JP-A-8-262419 is applied to an EL device, the film-sealed EL element portion may be exposed to the etching liquid and thereby damaged.

The present invention has been made to solve the above problems, and one of objects of the invention is therefore to provide a method for thinning the substrate of an EL device capable of easily thinning the substrate without lowering the operability in manufacture or adversely affecting the EL element portion.

According to one aspect of the invention, there is provided a method for thinning a substrate of an EL device having the substrate and an EL element portion formed on the substrate, the method including: disposing two substrates, EL element portions are formed on respective surfaces thereof, in such an arrangement that the EL element portions are opposed to each other; bonding, in the arrangement, the two substrates to each other with a sealing material to seal the EL element portions; and performing thinning processing on the two substrates.

BRIEF DESCRIPTION OF THE DRAWINGS

The objects and advantages of the present invention will become more apparent by describing preferred exemplary embodiments thereof in detail with reference to the accompanying drawings, wherein.

DETAILED DESCRIPTION OF THE PREFERRED EMBODIMENTS

An embodiment of the present invention will be hereinafter described with reference to the accompanying drawings.

Figure 1:
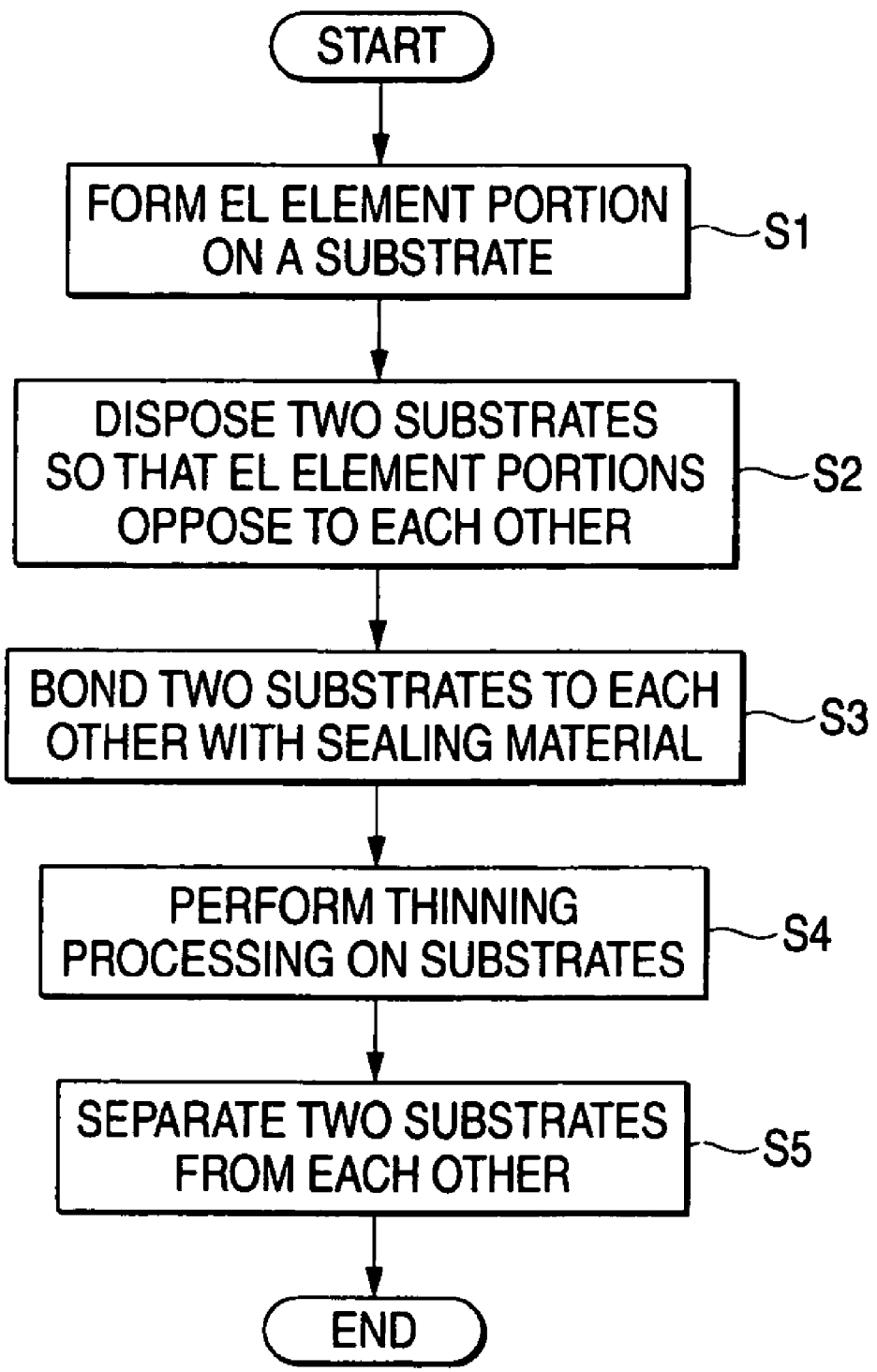
FIG. 1 is a flowchart of a method for thinning the substrate of an EL device according to an embodiment of the present invention.
Figure 2:
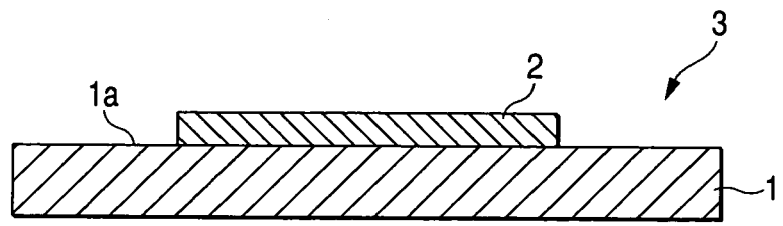
FIG. 2 shows how an EL element portion is formed on each substrate according to the embodiment.

A method for thinning the substrate of an EL device according to the embodiment of the invention will be described with reference to a flowchart of FIG. 1. First, at step S1, an EL device 3 is formed by forming a film of an EL (electroluminescence) element portion 2 on a front surface 1a of a glass substrate 1 by a known method as shown in FIG. 2. The EL element portion 2 has a pair of electrode layers and a light-emitting layer that is interposed between the two electrode layers. To prevent entrance of external water, gas, etc., the two electrode layers and the light-emitting layer are sealed with a film. The EL element portion 2 is smaller in size than the glass substrate 1, and the front surface 1a of the glass substrate 1 has an exposed portion around the EL element portion 2. Terminals etc. (not shown) for external connections are formed in a peripheral portion of the EL element portion 2.

Figure 3:
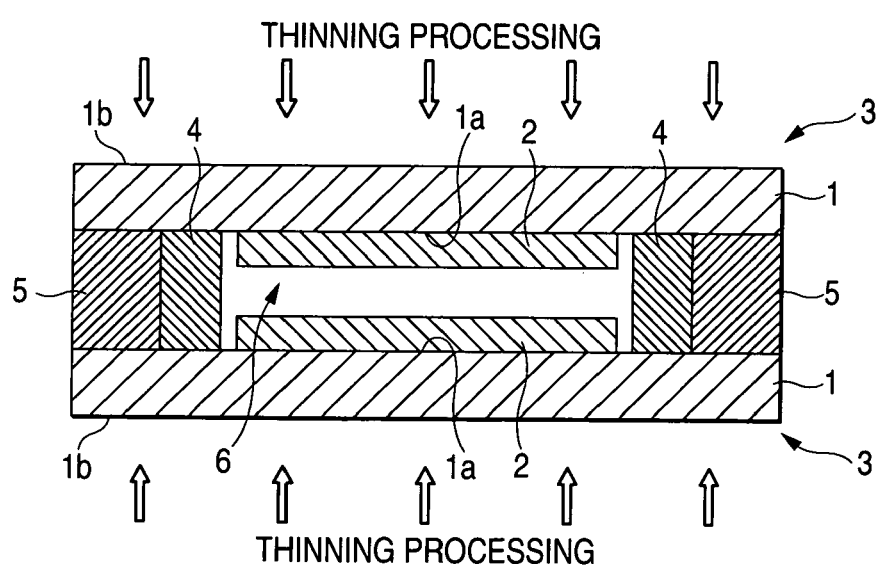
FIG. 3 shows how thinning processing is performed on two bonded substrates according to the embodiment.

At step S2, as shown in FIG. 3, the glass substrates 1 of two such EL devices 3 are disposed in such a manner that the EL element portions 2 formed on the respective front surfaces 1a are opposed to each other. Spacers 4 are disposed between the two glass substrates 1 so that the EL element portions 2 are separated from each other and do not interfere with each other. The spacers 4 are disposed outside the terminals etc. for external connections of the EL element portion 2. At step S3, in this state, the peripheral portions of the two glass substrates 1 are bonded to each other with a sealing material 5, whereby a hollow portion 6 formed between the two glass substrates 1 is sealed with the sealing material 5 and isolated from the outside. The sealing material 5 is a material such as not to be penetrated or eroded by an etching liquid. The sealing material 5 is bonded to the front surfaces 1a of the respective glass substrates 1. Then, at step S4, the two glass substrates 1 that are integrated together are immersed in the etching liquid, that is, they are subjected to thinning processing. Since back surfaces 1b of the two glass substrates 1 are exposed, the back surfaces 1b directly touch and are thereby etched with the etching liquid. The two glass substrate 1 can thus be thinned simultaneously.

In this state, the hollow portion 6 that is formed between the two glass substrates 1 is sealed with the sealing material 5, which prevents trouble that, for example, each EL element portion 2 located in the hollow portion 6 is exposed to the etching liquid and thereby damaged.

EL element portions 2 can be formed on thick glass substrates 1 because the glass substrates 1 can be thinned after the EL element portions 2 are formed thereon. This makes it possible to form EL element portions 2 efficiently without lowering the operability in each step of the formation of the EL element portions 2.

After the two individual glass substrates 1 have been thinned to a predetermined thickness by etching, at step S5 the peripheral portions of the glass substrates 1 on which the spacers 4 and the sealing material 5 are provided are cut away by scribing the back surfaces 1b of the glass substrates 1 and cutting the glass substrates 1 at the positions corresponding to the spacers 4, whereby the two glass substrates 1 are separated from each other. In this manner, two EL devices that have been thinned and reduced in weight can be obtained simultaneously.

Figure 4:
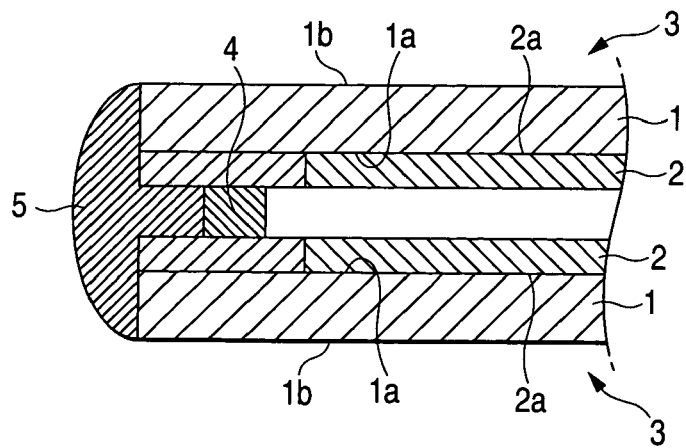
FIG. 4 is a partial sectional view showing how two substrates are bonded to each other according to a modification of the embodiment.

As shown in FIG. 4, a pair of EL devices 3 may be used in which EL element portions 2 are formed on the entire front surfaces 1a of the two glass substrates 1. In this case, spacers 4 are disposed between the EL element portions 2 and outside of central, effective element portions 2a of the EL element portions 2. In this state, the two glass substrates 1 are bonded to each other with a sealing material 5 by applying the sealing material 5 so as to also cover the side faces of the glass substrates 1. Then, the two glass substrates 1 are subjected to thinning processing.

Although the glass substrates 1 are used in the above embodiment, Si, resin, or metal substrates may be used as the substrates of EL devices.

Although in the above embodiment the two glass substrates 1 are thinned by etching, the invention is not limited to such a case. Substrates may be thinned by thinning processing that is suitable for the material of the substrates of EL devices. Among other thinning methods are grinding and blasting. In the case of grinding, the two substrates can be thinned simultaneously by doing double-sided grinding.

The spacers 4 may be omitted by disposing a pair of glass substrates 1 in such a manner that EL element portions 2 formed on front surfaces 1a of the respective glass substrates 1 are separated from and opposed to each other and then bonding the two glass substrates 1 to each other with a sealing material 5 in this state. However, it is preferable that the spacers 4 be disposed between the two glass substrates 1 as in the above embodiment, because each glass substrate 1 is supported by the spacers 4 in scribing its back surface 1b, which suppresses development of cracks or the like in each glass substrate 1 and enables efficient separation of the two glass substrates 1.

Another modification is as follows. A pair of large-sized glass substrates is prepared in which a large number of EL element portions are formed on the front surface of each glass substrate. After sealing is performed by bonding peripheral portions of the two glass substrates to each other with a sealing material, the two glass substrates are thinned by subjecting those to thinning processing, for example, immersing those in an etching liquid. A large number of thin, lightweight EL devices can be obtained easily by separating the two glass substrates from each other with scribing after the thinning and then dividing each glass substrate into parts bearing respective EL element portions.

The invention can be applied to both of bottom emission type EL devices in which a transparent electrode, a light-emitting layer, and a reflective electrode are laid on a substrate in this order and light that is emitted from the light-emitting layer is output after passing through the transparent electrode and the substrate and top emission type EL devices in which a reflective electrode, a light-emitting layer, and a transparent electrode are laid on a substrate in this order and light that is emitted from the light-emitting layer is output after passing through the transparent electrode that is opposite to the substrate.

Further, the invention can be applied to both of organic EL devices and inorganic EL devices.

As described above with reference to the embodiment, there is provided a method for thinning a substrate of an EL device having the substrate and an EL element portion formed on the substrate, the method including: disposing two substrates 1, EL element portions 2 are formed on respective surfaces 1a thereof, in such an arrangement that the EL element portions 2 are opposed to each other; bonding, in the arrangement, the two substrates 1 to each other with a sealing material 5 to seal the EL element portions 2; and performing thinning processing on the two substrates.

Two substrates 1 are disposed in such a manner that EL element portions 2 formed on their respective front surfaces 1a are opposed to each other. In this state, the two substrates 1 are bonded to each other with a sealing material 5, whereby the EL element portions 2 between the two substrates 1 are sealed with the sealing material 5 and isolated from external environment. Then, thinning processing is performed on the two individual substrates 1 that are integrated together. Since the back surfaces 1b (i.e., the surfaces opposite to the front surfaces 1a on which the EL element portions 2 are formed) of the two respective substrates 1 are exposed, the thinning processing is performed directly on the back surfaces 1b of the respective substrates 2 and the two individual substrates 2 are thereby thinned.

The thinning processing for thinning the two substrates 2 may be etching, grinding, or blasting.

The two substrates 2 may be separated from each other after the thinning processing by cutting away portions of the respective substrates 2 on which the sealing material 5 is provided.

It is preferable that the two substrates 1 be disposed in such a manner that the EL element portions 2 are separated from and opposed to each other by interposing spacers 4 between the two substrates. The spacers 4 may be double-sided adhesive tapes, where the double-sided adhesive tapes are given not only a spacer function but also a holding function of fixing the two substrates to each other.

Where the spacers 4 are used, it is preferable to cut away, after the thinning processing, portions of the respective substrates 1 on which the sealing material 5 is provided by cutting the individual substrates 1 at positions corresponding to the spacers 4.

Figure 5:
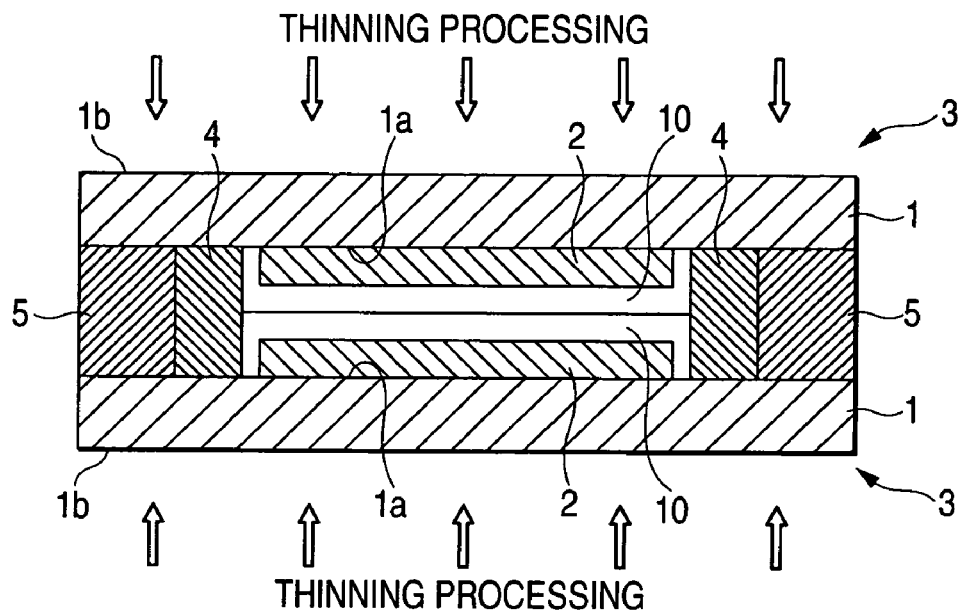
FIG. 5 is a partial sectional view of an EL device according to a modification of the embodiment of the present invention.

It is preferable that the EL element portion 2 that is formed on the front surface of each substrate 1 be sealed with a sealing film 10 as shown in FIG. 5.

The substrates 1 may be glass substrates.

Figure 6:
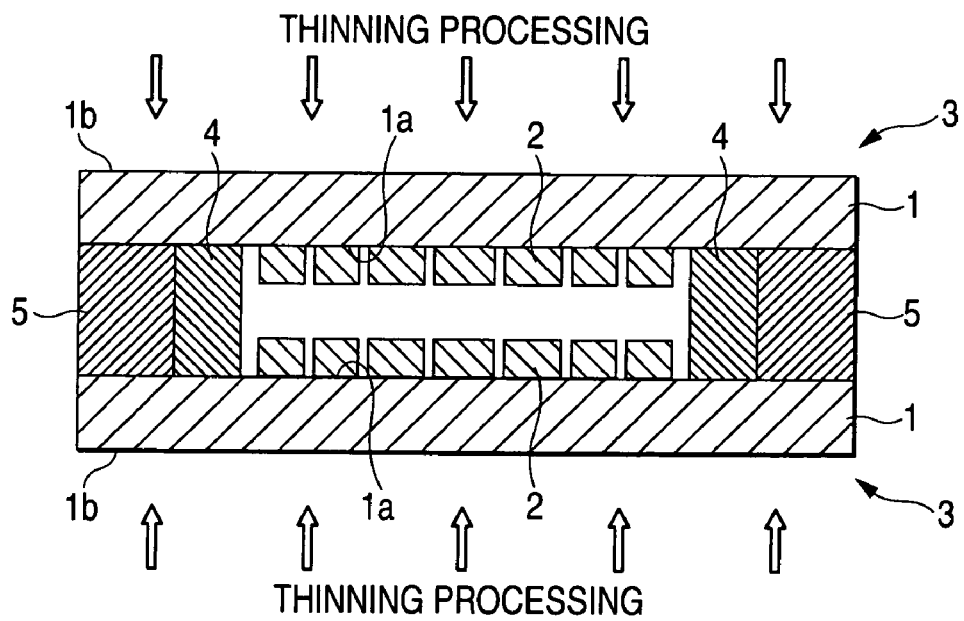
FIG. 6 is a partial sectional view of an EL device according to another modification of the embodiment of the present invention.

It is preferable that a plurality of the EL element portions 2 be formed on the front surface of each substrate 1 as shown in FIG. 6.

In the invention, two substrates in which EL element portions are formed on their respective front surfaces are disposed in such a manner that the EL element portions are opposed to each other. In this state, the two substrates are bonded to each other with a sealing material, whereby the EL element portions are sealed and isolated from the outside. Then, thinning processing is performed on the two individual substrates. Therefore, each substrate can be thinned without lowering the operability in manufacture or adversely affecting the EL element portion.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A method for thinning a substrate of an EL device having the substrate and an EL element portion formed on the substrate, the method comprising:
   disposing two substrates, EL element portions are formed on respective surfaces thereof, in such an arrangement that the EL element portions are opposed to each other;
   bonding, in the arrangement, the two substrates to each other with a sealing material to seal the EL element portions;
   performing thinning processing on the two substrates; and
   separating the two substrates from each other after performing the thinning processing.

2. The method according to claim 1, wherein the thinning processing is etching.

3. The method according to claim 1, wherein the thinning processing is grinding.

4. The method according to claim 1, wherein the thinning processing is blasting.

5. The method according to claim 1, further comprising separating the two substrates from each other by cutting away portions of the respective substrates on which the sealing material is provided.

6. The method according to claim 1, wherein the two substrates are disposed in such an arrangement that the EL element portions are separated from and opposed to each other by interposing a spacer between the two substrates.

7. The method according to claim 6, further comprising separating the two substrates from each other by cutting away portions of the respective substrates on which the sealing material is provided.

8. The method according to claim 6, wherein the two substrates are separated from each other by cuffing the two substrates at positions where the spacer is provided.

9. The method according to claim 1, wherein the EL element portion formed on the surface of each of the two substrates is sealed with a sealing film.

10. The method according to claim 1, wherein the two substrates are glass substrates.

11. The method according to claim 1, wherein a plurality of the EL element portions are formed on the surface of each of the two substrates.

* * * * *